United States Patent [19]
Cargill

[11] Patent Number: 5,903,185
[45] Date of Patent: May 11, 1999

[54] HYBRID DIFFERENTIAL PAIRS FOR FLAT TRANSCONDUCTANCE

[75] Inventor: Robert S. Cargill, Portland, Oreg.

[73] Assignee: Maxim Integrated Products, Inc., Sunnyvale, Calif.

[21] Appl. No.: 08/770,460

[22] Filed: Dec. 20, 1996

[51] Int. Cl.⁶ ................................ H03F 3/45; H03F 1/32
[52] U.S. Cl. ..................... 327/563; 327/361; 327/307; 330/149; 330/252; 330/295
[58] Field of Search ................... 330/149, 252, 330/295, 253, 257, 260; 327/350, 352, 357, 359, 361, 307, 52, 65, 563, 405

[56] References Cited

U.S. PATENT DOCUMENTS

| | | | |
|---|---|---|---|
| 5,115,409 | 5/1992 | Stepp | 327/357 |
| 5,420,538 | 5/1995 | Brown | 330/252 |
| 5,469,106 | 11/1995 | Dow | 330/257 |
| 5,471,173 | 11/1995 | Moore et al. | 327/350 |
| 5,475,328 | 12/1995 | Kimura | 327/352 |
| 5,489,878 | 2/1996 | Gilbert | 331/57 |
| 5,497,123 | 3/1996 | Main et al. | 330/257 |
| 5,572,166 | 11/1996 | Gilbert | 330/254 |
| 5,734,299 | 3/1998 | Brown | 330/254 |
| 5,815,039 | 9/1998 | Kimura | 330/261 |

FOREIGN PATENT DOCUMENTS

| | | | |
|---|---|---|---|
| 0 400 650 A2 | 5/1990 | European Pat. Off. | H03F 3/45 |
| 3027071 A1 | 11/1982 | Germany | H03F 3/45 |

*Primary Examiner*—Timothy P. Callahan
*Assistant Examiner*—Terry L. Englund
*Attorney, Agent, or Firm*—Blakely, Sokoloff, Taylor & Zafman LLP

[57] ABSTRACT

Hybrid differential pairs and methods of their hybridization by connecting and operating in parallel a degenerated differential pair with a multitanh. Proper matching of the degenerated differential pair and the multitanh results in higher linearity levels than can be attained with either approach individually. Also, the hybrid benefits from reduced process variation when compared with prior multitanh solutions. Increased gain, increased linearity, reduced noise and reduced supply current can all be achieved in a manufacturable fashion using the invention.

9 Claims, 3 Drawing Sheets

HYBRID DIFFERENTIAL PAIRS FOR FLAT TRANSCONDUCTANCE

BACKGROUND OF THE INVENTION

1. Field of the Invention

The present invention relates to the field of transconductors, and more particularly to linear transconductors.

2. Prior Art

One of the basic building blocks in analog electronics is the transconductor, permitting the designer to convert an input voltage signal into a current-mode signal. The differential pair is the most common, but suffers from an inherently small linear input range. In order to increase the linear input range, feedback in the form of emitter degeneration is typically used. This form of feedback improves linearity at the expense of gain and noise performance. To reduce power supply consumption, an alternative linearization technique was developed, known as the multitanh. The multitanh approach involves using a pair of parallel connected differential pairs with intentional symmetrical input offsets forced by emitter area ratios. Others have used more than two differential pairs with varying offsets to attempt to achieve a wider linear input range. However, this method suffers significant degradation in performance when process variation of the devices is considered.

The standard degenerated transconductor is shown in FIG. 1. It is the most common open loop form of linearization. As shown, resistors R1 and R2 (R1=R2) in the emitter circuits of transistors Q1 and Q2 (of equal size) broaden the transconductance versus differential input curve of the differential pair, at the expense of gain and noise, to provide a wider range of differential input for a given error in linearity. The collector circuits of transistors Q1 and Q2 of FIG. 1, as well as the collector circuits of transistors Q3, Q4, Q5 and Q6 of FIG. 2, are shown as being coupled by resistors R5 and R6, respectively, and resistors R7 and R8, respectively, to VCC. In a typical circuit, the collector circuits would likely differ however. By way of one example only, in a typical operational amplifier, the current in one collector circuit is mirrored to the other collector circuit, which thus becomes a summing point for the difference in currents in the input transistors, converting the differential voltage input to a single ended current output for the input stage of the operational amplifier.

The multitanh circuit shown in FIG. 2 has found increased use recently due to the continued push to lower supply voltages and lower power consumption. With transistor Q3 larger than transistor Q4, the peak transconductance of this differential pair is skewed toward a negative differential input voltage (Vinn greater than Vinp). With transistor Q5 larger than transistor Q6, the peak transconductance of the second differential pair is skewed toward a positive differential input voltage (Vinp greater than Vinn). The net effect is to flatten and broaden the transconductance of the parallel combination of the transistor pairs. The 4:1 area ratio flattens the transconductance characteristic as much as possible without introducing a minimum in transconductance (Gm) at zero differential input.

While the multitanh extends the linear range beyond that of an undegenerated differential pair, it still is only good for about 40 mvpp of input signal before the transconductance falls more than 1% from the peak. The use of more than two differential pairs with offsets of the additional pairs forced by higher emitter area ratios have also been proposed to further flatten the transconductance curve. However, the inventor has found these suffer marked performance degradations over processing conditions due to a sensitivity to physical emitter resistance in the bipolar junction transistors.

SUMMARY OF THE INVENTION

The present invention involves a hybridization of the two techniques found in the prior art. By paralleling a standard degenerated differential pair with a multitanh input stage, higher linearity levels can be attained than with either approach individually. Also, the hybrid benefits from reduced process variation when compared with prior multitanh solutions. Increased gain, increased linearity, reduced noise and reduced supply current can all be achieved in a manufacturable fashion using this new approach.

DETAILED DESCRIPTION OF THE PRESENT INVENTION

Figure 1:
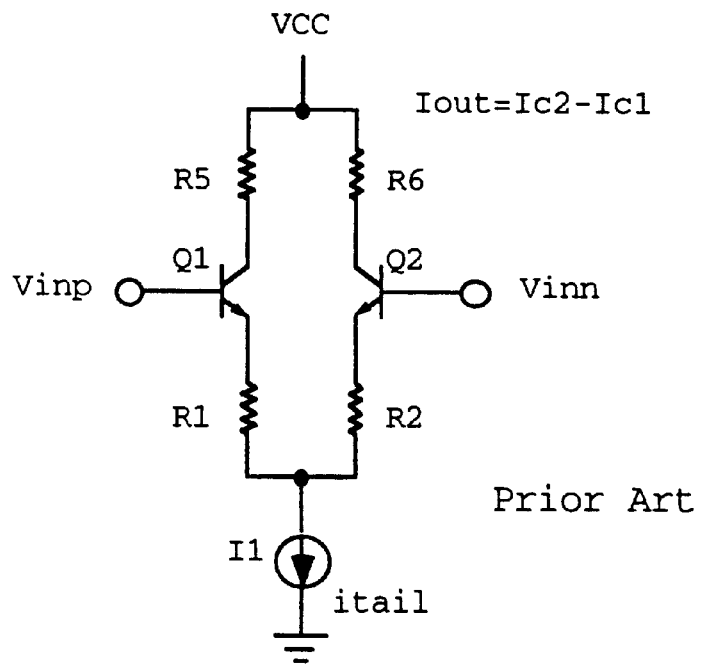
FIG. 1 is a circuit diagram for a prior art degenerated transconductor.
Figure 2:
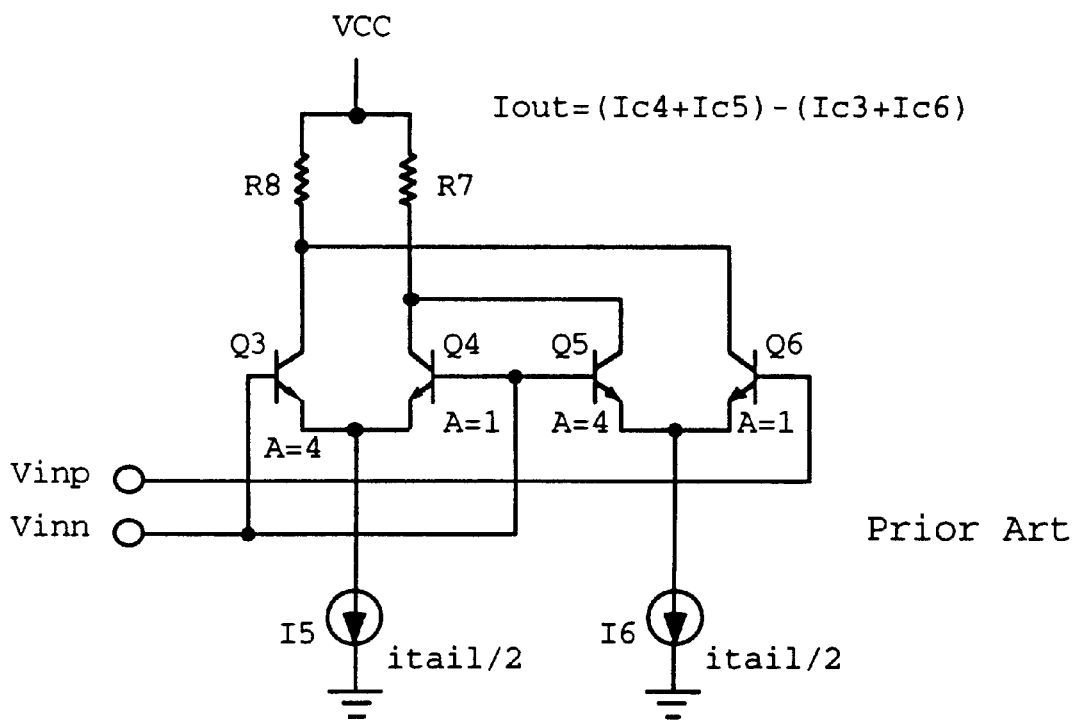
FIG. 2 is a circuit diagram for a prior art multitanh.
Figure 3:
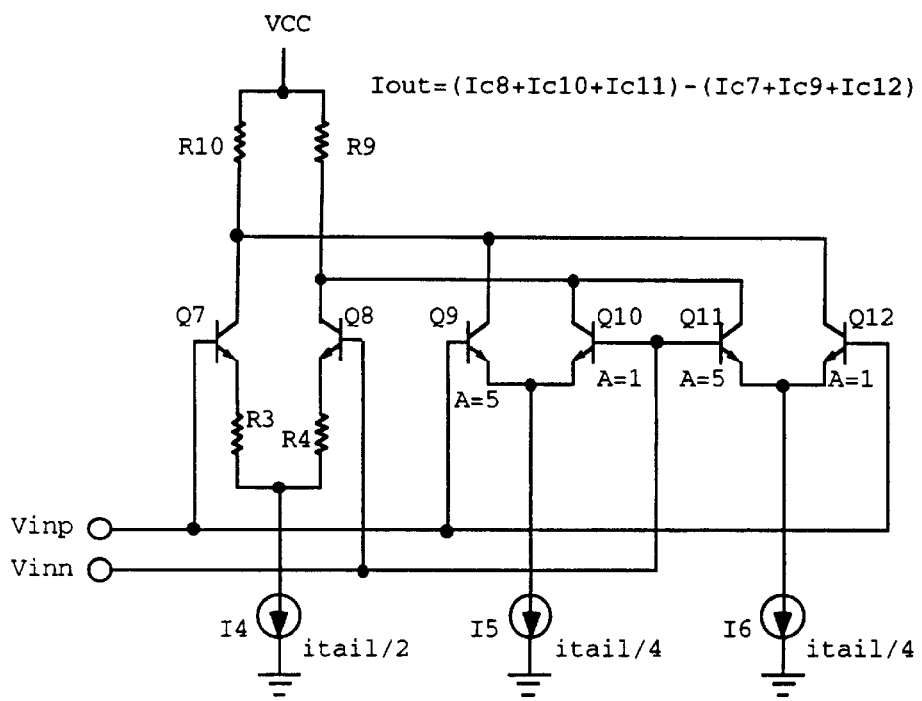
FIG. 3 is a circuit diagram for a hybrid transconductor in accordance with the present invention.

The hybrid transconductor of the present invention is shown in FIG. 3. As shown, the hybrid transconductor is comprised of a degenerated differential pair consisting of transistors Q7 and Q8, resistors R3 and R4 and current source I4, together with a multitanh consisting of transistors Q9, Q10, Q11 and Q12 and current sources I5 and I6. The two circuits have both their differential inputs and their outputs connected in parallel. Transistors Q9 and Q11 each have 5 times the emitter area of each of transistors Q10 and Q12. Also in this embodiment, the total tail current itail is divided equally between the degenerated differential pair and the multitanh, with tail current for the multitanh being divided equally between the two differential pairs of the multitanh. Preferably, but not necessarily, the transistors Q7 and Q8 will have the same area as transistors Q10 and Q12, with resistors R3 and R4 being selected to provide the desired amount of degeneration for the degenerated differential pair.

By building the multitanh with a 5:1 emitter area ratio, negative curvature is introduced into the transconductance characteristic for the multitanh between two peaks in the transconductance curve. This reduces the linearity of the multitanh in comparison with the 4:1 implementation found in the prior art. However, this negative curvature can be used to advantage when combined with the slight positive curvature of the degenerated differential pair. The combined transconductance linearity is flatter than achieved with the 4:1 multitanh alone, and is considerably more manufacturable. It also is beneficial in low noise applications, in that it can easily be applied to resistively biased circuits. (Higher order multitanh solutions are difficult to implement with resistive bias.) The transconductance for a given supply current is higher than achieved with the standard degenerated differential pair solution, and the noise is lower due to the absence of resistive degeneration in the multitanh half of the hybrid.

Figure 5:
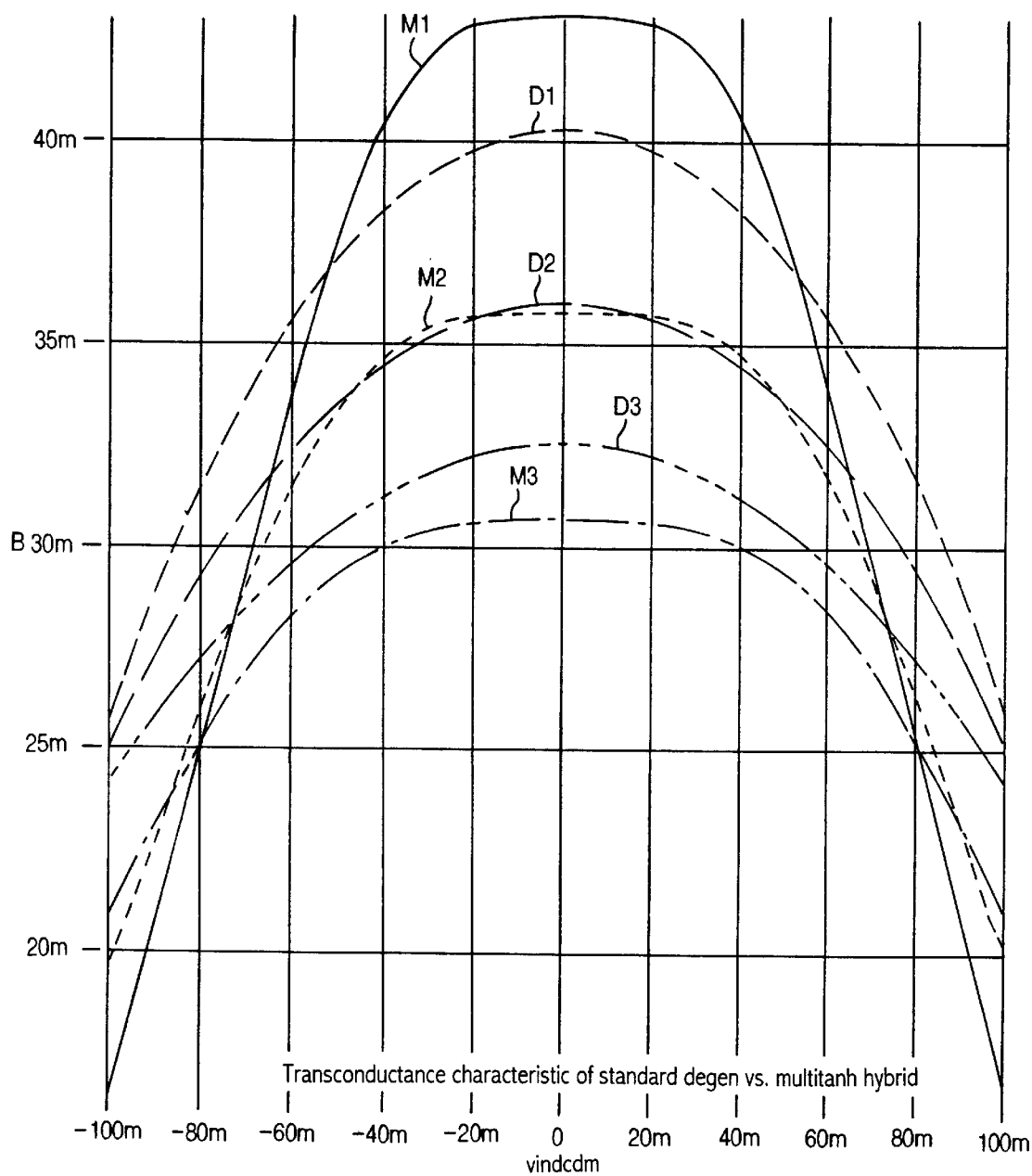
FIG. 5 presents curves illustrating the improvement in linearity yielded by the hybrid of the present invention over a prior art degenerated differential pair.

The curves in FIG. 5 show the improvement in linearity yielded by the hybrid of the present invention over a prior art degenerated differential pair. In these curves, taken from circuit simulations, the horizontal axis is the differential input in volts and the vertical axis is the transconductance in units of amps/volt. Curves M1, M2 and M3 are curves for the hybrid circuit of the present invention at temperatures of −40, 25 and 90 degrees centigrade, respectively, while curves D1, D2 and D3 are curves for a prior art degenerated differential pair at temperatures of −40, 25 and 90 degrees centigrade, respectively, for equal transconductance and current consumption. Corresponding curves for a prior art 4 to 1 multitanh would be similar to the hybrid of the present invention, though the flat portion of the curves would be narrower than for the hybrid.

Figure 4:
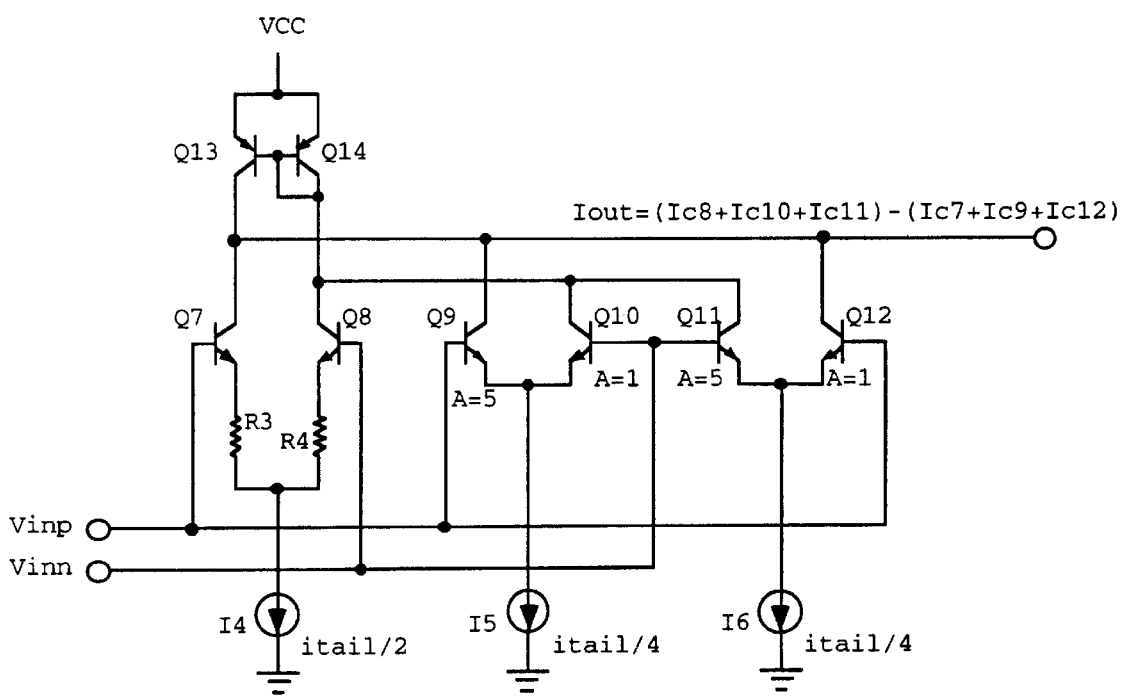
FIG. 4 is a circuit diagram for the hybrid of the present invention as used as part of a typical operational amplifier input stage, converting the differential input to a single ended output.

The method of the present invention is particularly suited to low power, low noise, high linearity, and high frequency applications, but is useful generally in any situation where a differential pair will see large signal operation. This can include the input stages of operational amplifiers running fairly close to their gain-bandwidth product, in addition to open loop RF configurations. By way of example, FIG. 4 is a circuit diagram for the hybrid of the present invention as used as part of a typical operational amplifier input stage, converting the differential input to a single ended output. As shown, the collector currents for transistors Q8, Q10 and Q11 are mirrored by transistors Q13 and Q14, so that the current output is the difference in the currents in transistor Q13 and the collector currents of transistors Q7, Q9 and Q12. Thus:

Iout=(Ic8+Ic10+Ic11)−(Ic7+Ic9+Ic12)

In constructing a hybrid transconductor, the first major factor to consider is input signal size. For signals exceeding 120 mVpp, the standard degenerated approach will yield better results than the hybrid, due to the sharp falloff in transconductance beyond a differential input of 60 mV on the 5:1 multitanh. If signal levels are very small, the current density through the hybrid combination may not be high enough to keep the gain up when compared with the standard solution. However, for signals between 10 mvpp and 120 mvpp, there is usually some amount of hybridization that will yield an improvement in linearity.

In constructing a resistively-loaded hybrid amplifier, for instance, gain, tolerable noise levels and output impedance play a dominant role in selecting tail currents, device sizes and degeneration. For low noise applications, the load is likely to be a fairly low impedance, and this coupled with the gain requirements will yield the required transconductance by $A_v = G_m * R_l$, where $A_v$ is the voltage gain of the amplifier when operating into a load resistance of $R_l$, and $G_m$ is the transconductance of the transconductance amplifier. This will also drive the size of the unit transistor used, since $R_b$, the base resistance of the unit transistors, is a major factor in the noise performance and bandwidth of the amplifier.

Once the load and required transconductance are known, one can construct a hybrid with currents split in a 2/1/1 ratio from the standard transconductor to the two pieces of the 5:1 multitanh respectively. The 2/1/1 ratio is just an initial guess for the hybridization, and it can be changed depending on process variation. The degeneration resistor and unit current preferably should be chosen to contribute half of the necessary transconductance by using $G_m = g_m/(1+g_m*R_e)$ where $g_m$=the transconductance of the unit transistor=$I_c/V_t$, where $V_t$=kt/q (k=Boltzmann constant), and $R_e$=the resistor connected to the emitter. The degeneration resistor should also be chosen such that the curvature of the standard degeneration is the inverse of the curvature of the 5:1 multitanh.

While nearly independent of tail current, the multitanh curvature is highly dependent on the physical $R_e$ for the given process, so there is no easy rule to follow except to change the standard degeneration current and resistance until the curvatures cancel. The curvature varies (sometimes dramatically) with processing-related changes in $R_e$, so a fair amount of reliance on process models is required. If the designer finds that the curvature of the multitanh exceeds that of the degeneration, the degeneration resistor must be reduced to compensate. This will both increase the net transconductance and reduce the noise levels, so it is probably easiest to approach the solution from this side. The total current through the combination can then be backed off until the gain is again in spec.

The final variation is process variation. For high Re, the multitanh curvature will decrease, and depending on process variability, may even turn positive. Finding the "sweet spot" where linearity is maximized at the process center and still acceptable at the edges requires a fair amount of trial and error. For processes with high Re variability, the designer may find it necessary to derive a higher portion of the transconductance from the standard degenerated portion of the hybrid (meaning more than 50% of the total tail current would be in the degenerated transconductor piece, like 3/1/1). In processes with less Re variability, it may be possible to get more transconductance from the multitanh piece, in which case greater than 50% of the total current would be burned in the multitanh tails (like 1/1/1). This is preferred, since the transconductance per unit current and noise per unit transconductance are lower for the multitanh than the degenerated piece, but process variation typically makes such ratios impossible to manufacture.

If Re were controlled well enough, higher ratio multitanhs could be used to extend the linearity beyond the 120 mvpp level attainable with the 5:1. However, at least most present day processes do not provide a tight enough control on physical Re for this to be a viable option.

The present invention is beneficial over the prior art at signal levels from 0–100 mvpp. Above that signal level, the fixed linear range of the multitanh part of the hybrid actually begins to detract from the total performance by pulling the transconductance down at a higher rate. In one specific design, the hybrid permitted the output linearity to be increased by 3 dB or more in many situations, and permitted slightly higher conversion gains for the same supply current.

In the embodiments of FIGS. 3 and 4, the tail currents I4, I5 and I6 are shown as being provided by current sources (sources and sinks being referred to generally herein simply as sources). These current sources may be active current sources if desired, or may simply be resistors.

While the present invention has been disclosed and described with respect to a preferred embodiment thereof, it will be understood by those skilled in the art that various changes in form and detail may be made therein without departing from the spirit and scope thereof.

What is claimed is:

1. A hybrid transconductor comprising:

first through sixth transistors, each having an emitter, a base and a collector;

first and second resistors;

first, second and third current sources;

the collectors of the first, third and sixth transistors being coupled together;

the collectors of the second, fourth and fifth transistors being coupled together;

the emitters of the first and second transistors being coupled to the first current source through the first and second resistors, respectively;

the emitters of the third and fourth transistors being coupled to the second current source;

the emitters of the fifth and sixth transistors being coupled to the third current source;

the bases of the first, third and sixth transistors being coupled together to form a first transconductor input;

the bases of the second, fourth and fifth transistors being coupled together to form a second transconductor input; and the third and fifth transistors each have an emitter area approximately N times the respective emitter area of the fourth and sixth transistors, where N is greater than 1.

2. The hybrid transconductor of claim 1 wherein the first, second and third current sources each comprise at least one resistor.

3. The hybrid transconductor of claim 1 wherein the third and fifth transistors have an emitter area approximately five times the emitter area of the fourth and sixth transistors and the second and third current sources are approximately equal current sources.

4. The hybrid transconductor of claim 3 wherein the first current source sources twice as much current as the second current source.

5. A hybrid transconductor comprising a multitanh circuit and a degenerated differential pair, the multitanh circuit and the degenerated differential pair having their inputs connected together and their outputs connected together, the multitanh circuit including first and second differential pair transistors, a first transistor of each of the first and second differential pair transistors having an emitter area approximately N times the emitter area of a second transistor of each of the first and second differential pair transistors, where N is greater than 1.

6. The hybrid transconductor of claim 5 wherein transconductance of the multitanh has a negative curvature.

7. The hybrid transconductor of claim 6 wherein the degenerated pair provides a positive transconductance curvature to substantially offset the negative transconductance curvature of the multitanh to provide a substantially flat transconductance for the hybrid transconductor.

8. The hybrid transconductor of claim 5 wherein the multitanh is approximately a 5 to 1 multitanh.

9. The hybrid transconductor of claim 8 wherein the degenerated pair provides a positive transconductance curvature to substantially offset a negative transconductance curvature of the multitanh to provide a substantially flat transconductance for the hybrid transconductor.

\* \* \* \* \*